(12) United States Patent
Tsai et al.

(10) Patent No.: US 10,741,231 B1
(45) Date of Patent: Aug. 11, 2020

(54) MEMORY ACCESS INTERFACE DEVICE INCLUDING PHASE AND DUTY CYCLE ADJUSTING CIRCUITS FOR MEMORY ACCESS SIGNALS

(71) Applicant: Realtek Semiconductor Corporation, Hsinchu (TW)

(72) Inventors: Fu-Chin Tsai, Taipei (TW); Chun-Chi Yu, Zhubei (TW); Chih-Wei Chang, Hsinchu County (TW); Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/408,873

(22) Filed: May 10, 2019

(51) Int. Cl.
    G11C 8/18       (2006.01)
    G11C 16/08      (2006.01)
    G06F 1/08       (2006.01)
    H03L 7/07       (2006.01)
    G06F 1/12       (2006.01)
    G11C 16/32      (2006.01)

(52) U.S. Cl.
    CPC .......... *G11C 8/18* (2013.01); *G06F 1/08* (2013.01); *G06F 1/12* (2013.01); *G11C 16/08* (2013.01); *G11C 16/32* (2013.01); *H03L 7/07* (2013.01)

(58) Field of Classification Search
    None
    See application file for complete search history.

(56) References Cited

U.S. PATENT DOCUMENTS

| | | | |
|---|---|---|---|
| 6,118,729 A * | 9/2000 | Hirabayashi | G11C 7/1006 365/233.13 |
| 2002/0194520 A1* | 12/2002 | Johnson | G06F 9/30098 713/600 |
| 2009/0043955 A1* | 2/2009 | Butt | G11C 7/1078 711/105 |
| 2009/0222707 A1* | 9/2009 | Shin | G06F 11/1004 714/758 |
| 2012/0311251 A1* | 12/2012 | Best | G06F 3/061 711/105 |
| 2013/0083611 A1* | 4/2013 | Ware | G06F 3/0673 365/191 |
| 2013/0121100 A1* | 5/2013 | Deivasigamani | G06F 13/1689 365/233.11 |
| 2017/0053684 A1* | 2/2017 | Choi | G11C 16/32 |
| 2019/0172509 A1* | 6/2019 | Kang | G11C 7/1093 |

* cited by examiner

Primary Examiner — J. H. Hur
(74) Attorney, Agent, or Firm — Locke Lord LLP; Tim Tingkang Xia, Esq.

(57) ABSTRACT

A memory access interface device that includes a clock generation circuit that generates reference clock signals according to a source clock signal and access signal transmission circuits are provided. Each of the access signal transmission circuits includes a first and a second clock frequency division circuits, a phase adjusting circuit and a duty cycle adjusting circuit. The first and the second clock frequency division circuits sequentially divide the frequency of one of the reference clock signals to generate a first and a second frequency divided clock signals respectively. The phase adjusting circuit adjusts the phase of an access signal according to the second frequency divided clock signal to generate a phase-adjusted access signal. The duty cycle adjusting circuit adjusts the duty cycle of the phase-adjusted access signal to be a half of the time period to generate an output access signal to access a memory device.

11 Claims, 5 Drawing Sheets

US 10,741,231 B1

MEMORY ACCESS INTERFACE DEVICE INCLUDING PHASE AND DUTY CYCLE ADJUSTING CIRCUITS FOR MEMORY ACCESS SIGNALS

BACKGROUND

Field of Disclosure

The present disclosure relates to memory access technology. More particularly, the present disclosure relates to a memory access interface device.

Description of Related Art

The configuration of single data rate (SDR) having a low speed is used in the early development of NAND flash memory technology. However, due to the increasing requirement of the bandwidth of the products, the conventional configuration of single data rate cannot fulfill the requirement of the speed. As a result, the configuration of non-volatile double data rate (NVDDR) is proposed to break the speed limit. The specifications of NVDDR having higher and higher speed are further proposed under such a configuration. However, the memory controllers on the market are requested to support all the modes having different speeds and the ability of signal calibration.

Accordingly, what is needed is a memory access interface device to address the above issues.

SUMMARY

An aspect of the present disclosure is to provide a memory access interface device that includes a clock generation circuit and a plurality of access signal transmission circuits. The clock generation circuit is configured to generate a plurality of reference clock signals that are independent from each other and each having an adjustable phase according to a source clock signal. Each of the access signal transmission circuits includes a first clock frequency division circuit, a second clock frequency division circuit, a phase adjusting circuit and a duty cycle adjusting circuit. The first clock frequency division circuit is configured to divide the frequency of one of the reference clock signals to generate a first frequency divided clock signal. The second clock frequency division circuit is configured to divide the frequency of the first frequency divided clock signal to generate a second frequency divided clock signal. The phase adjusting circuit is configured to receive an access signal from a memory access controller to adjust the phase of the access signal according to the second frequency divided clock signal to generate a phase-adjusted access signal. The duty cycle adjusting circuit is configured to adjust a duty cycle of the phase-adjusted access signal to generate and transmit an output access signal to a memory device to access the memory device.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
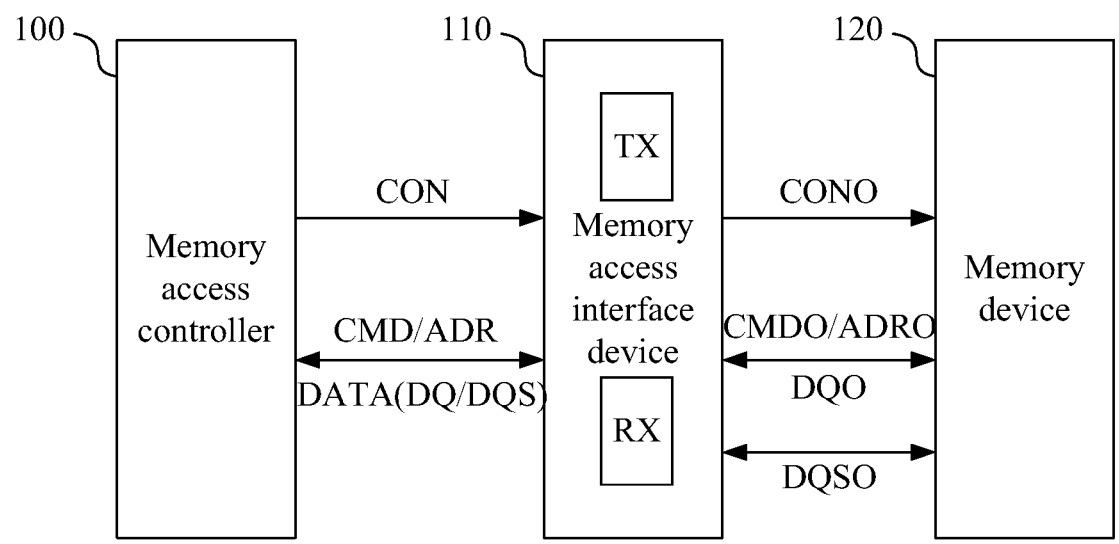
FIG. 1 is a block diagram of the memory in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is now made to FIG. 1. FIG. 1 is a block diagram of the memory 1 in an embodiment of the present invention. The memory 1 includes a memory access controller 100, a memory access interface device 110 and a memory device 120.

The memory 1 can be electrically coupled to other modules through such as, but not limited to a system bus (not illustrated). For example, the memory 1 can be electrically coupled to a processor (not illustrated) through a system bus such that the processor can access the memory 1.

External access signals, e.g. the access signals from the processor, can be received by the memory access controller 100 first and can be transmitted to the memory access interface device 110. Further, the access signals can be transmitted from the memory access interface device 110 to the memory device 120 to access the memory device 120.

More specifically, in an embodiment, the memory access controller 100 can receive and transmit the access signals including such as, but not limited to a control signal CON, a command signal CMD, an address signal ADR and a data signal DATA to the memory access interface device 110. The memory access interface device 110 adjusts the phase of the access signals including the control signal CON, the command signal CMD, the address signal ADR and the data signal DATA and generate an output control signal CONO, an output command signal CMDO, an output address signal ADRO and an output data signal DQO to the memory device 120. The internal data of the memory device 120 can be further accessed according to the correct timing.

It is appreciated that in some embodiments, the data signal DATA received by the memory access interface device 110 substantially include a data signal DQ and a data strobe signal DQS such that the memory access interface device 110 generates the corresponding output data signal DQO and a corresponding output data strobe signal DQSO. The memory device 120 samples the output data signal DQO according to the output data strobe signal DQSO.

In an embodiment, the memory access interface device 110 can be such as, but not limited to a physical layer circuit. The memory device 120 can be such as, but not limited to a NAND flash memory. Two paths can be disposed between the memory access controller 100 and the memory access interface device 110 and two paths can be disposed between the memory access interface device 110 and the memory device 120. One of the two paths between the memory access controller 100 and the memory access interface device 110 is to transmit the control signal CON and the other one of the two paths therebetween is shared by the transmission of the command signal CMD, the address signal ADR and the data signal DATA. One of the two paths between the memory access interface device 110 and the memory device 120 is to transmit the output control signal CONO and the other one of the two paths therebetween is shared by the transmission of the output command signal CMDO, the output address signal ADRO and the output data signal DQO.

It is appreciated that in the embodiment that the memory access interface device 110 generates the output data strobe signal DQSO, an additional path is required to perform transmission of the output data strobe signal DQSO between the memory access interface device 110 and the memory device 120.

The memory access interface device 110 substantially includes a receiver RX and a transmitter TX. The operation of the transmitter TX is described in detail in the following paragraphs.

Figure 2:
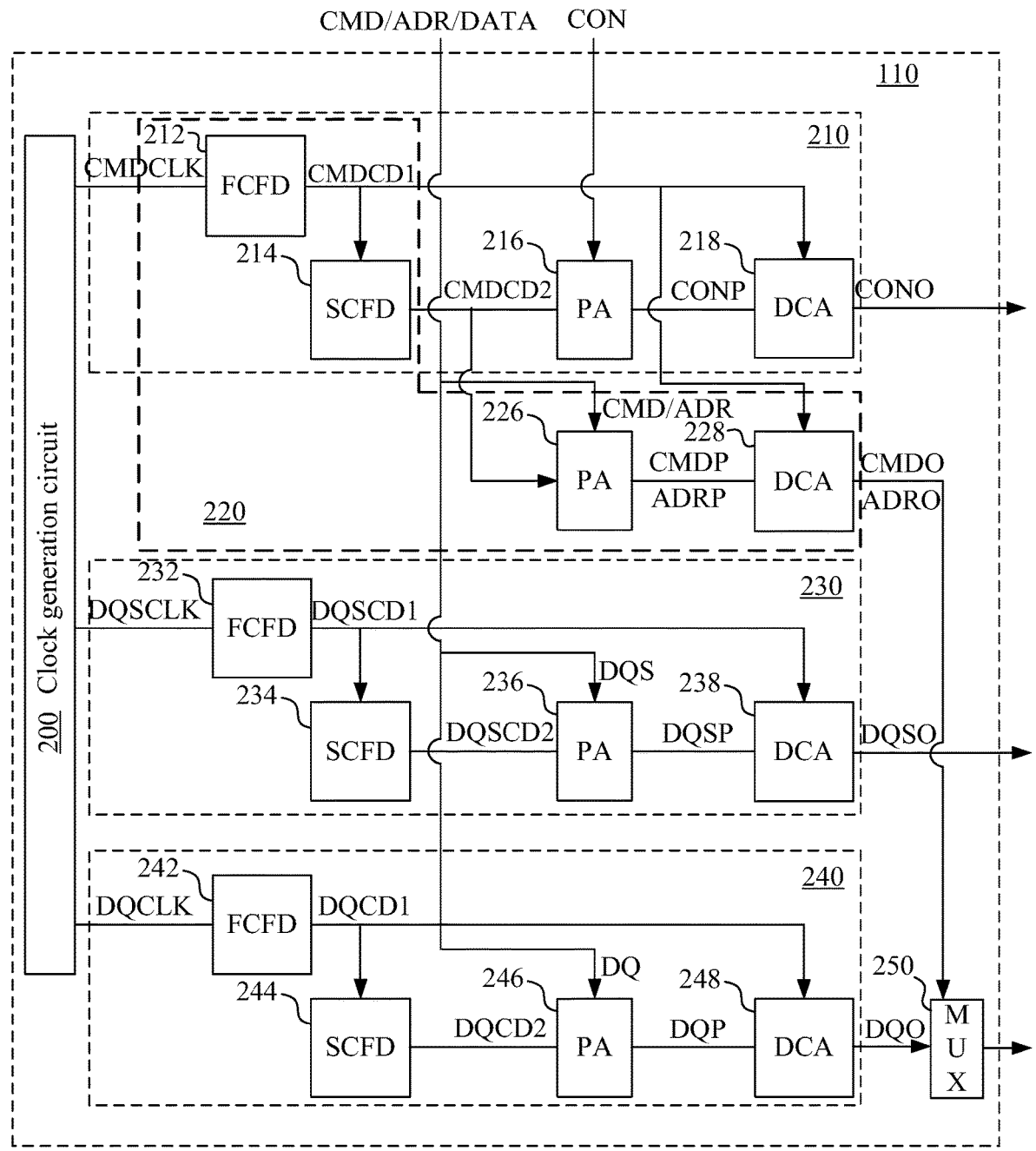
FIG. 2 is a detailed block diagram of the memory access interface device in FIG. 1 in an embodiment of the present invention.

Reference is now made to FIG. 2. FIG. 2 is a detailed block diagram of the memory access interface device 110 in FIG. 1 in an embodiment of the present invention. It is appreciated that only the transmitter TX of the memory access interface device 110 is illustrated in FIG. 2 without illustrating the receiver RX.

The memory access interface device 110 includes a clock generation circuit 200 and a plurality of access signal transmission circuits 210-240.

The clock generation circuit 200 is configured to generate reference clock signals that are independent from each other and each having an adjustable phase according to a source clock signal. The reference clock signals include such as, but not limited to a command reference clock signal CMDCLK, a data strobe reference clock signal DQSCLK and a data reference clock signal DQCLK.

The access signal transmission circuits 210-240 include a control signal transmission circuit 210, a command and address signal transmission circuit 220, a data strobe signal transmission circuit 230 and a data signal transmission circuit 240.

Take the control signal transmission circuit 210 as an example, the control signal transmission circuit 210 includes a first clock frequency division circuit (abbreviated as FCFD in FIG. 2) 212, a second clock frequency division circuit 214 (abbreviated as SCFD in FIG. 2), a phase adjusting circuit 216 (abbreviated as PA in FIG. 2) and a duty cycle adjusting circuit 218 (abbreviated as DCA in FIG. 2).

The first clock frequency division circuit 212 is configured to divide the frequency of the command reference clock signal CMDCLK to generate a first frequency divided clock signal CMDCD1. The second clock frequency division circuit 214 is configured to divide the frequency of the first frequency divided clock signal CMDCD1 to generate a second frequency divided clock signal CMDCD2.

Further, the phase adjusting circuit 216 is configured to receive the access signal, e.g. the control signal CON, from the memory access controller 100, to adjust the phase of the control signal CON according to the second frequency divided clock signal CMDCD2 to generate a phase-adjusted access signal, e.g. the phase-adjusted control signal CONP.

In an embodiment, the phase adjusting circuit 216 may include at least of flip-flop to sample the control signal CON according to the phase of the second frequency divided clock signal CMDCD2 to accomplish the phase-adjusting mechanism.

In an embodiment, when a rising edge of the second frequency divided clock signal CMDCD2 is within a set-up and hold time of a waveform of the control signal CON, a timing violation issue is easy to occur since the set-up and hold time is the transition time of the waveform of the control signal CON turning from a low state to a high state. As a result, in an embodiment, the phase adjusting circuit 216 can adjust the phase of the control signal CON according to a sample result of the rising edge and a falling edge of the second frequency divided clock signal CMDCD2. In an embodiment, when the signal transmission is not sampled by the rising edge of the second frequency divided clock signal CMDCD2 and the transmission is sampled by the falling edge of the second frequency divided clock signal CMDCD2, the phase adjusting circuit 216 can adjust the phase of the control signal CON according to such as, but not limited to the falling edge of the second frequency divided clock signal CMDCD2.

It is appreciated that the configuration of the phase adjusting circuit 216 described above is merely an example. In other embodiments, the configuration of the phase adjusting circuit 216 can be different.

The duty cycle adjusting circuit 218 is configured to adjust a duty cycle of the phase-adjusted control signal CONP to be a half of a time period according to the first frequency divided clock signal CMDCD1 to generate and transmit an output access signal, e.g. the output control signal CONO, to the memory device 120 to access the memory device 120.

In an embodiment, the memory access interface device 110 is preferably a NAND flash memory that supports from the single data rate (SDR) mode having a relative lower speed to the double data rate (DDR) mode, e.g. NVDDR1, NVDDR2 or NVDDR3, having a relative higher speed.

However, the clock generation circuit 200 is not able to provide different clock signals within a large range of frequencies. As a result, by disposing the first clock frequency division circuit 212, the clock signal having a higher frequency can be divided to generate the first frequency divided clock signal CMDCD1 under the low speed mode, which can be a low speed clock signal having the frequency of 5 MHz. In an embodiment, the first frequency divided clock signal CMDCD1 generated by the first clock frequency division circuit 212 can support the range of frequencies from 5 MHz to 1200 MHz.

Moreover, in order to support the double data rate mode that samples the data according to the rising edge and the falling edge at the same time, the duty cycle adjusting circuit 218 can operate according to the second frequency divided clock signal CMDCD2 further divided from the first frequency divided clock signal CMDCD1 such that the first frequency divided clock signal CMDCD1 having a higher speed is used to fine tune the duty cycle of the phase-adjusted control signal CONP to become 50-50, which is the half of a time period. The adjusted result is outputted as the output control signal CONO. It is appreciated that in practical implementation, the duty cycle may be deviated from the exact half of a time period by a reasonable difference due to the error caused by the components.

Similarly, the command and address signal transmission circuit 220 can include a configuration identical to the control signal transmission circuit 210. In an embodiment, the command and address signal transmission circuit 220 may share the first clock frequency division circuit 212 and the second clock frequency division circuit 214 with the control signal transmission circuit 210 and may further include a phase adjusting circuit 226 and a duty cycle adjusting circuit 228.

The operation of the first clock frequency division circuit 212 and the second clock frequency division circuit 214 is not described again herein. The phase adjusting circuit 226 is configured to receive the access signal, e.g. the command signal CMD or the address signal ADR, from the memory access controller 100, to adjust the phase of the command signal CMD or the address signal ADR according to the second frequency divided clock signal CMDCD2 to generate a phase-adjusted access signal, e.g. the phase-adjusted command signal CMDP or the phase-adjusted address signal ADRP.

The duty cycle adjusting circuit 228 is configured to adjust a duty cycle of the phase-adjusted command signal CMDP or the phase-adjusted address signal ADRP to be a half of a time period according to the first frequency divided clock signal CMDCD1 to generate and transmit an output access signal, e.g. the output command signal CMDO or the output address signal ADRO, to the memory device 120 to access the memory device 120.

Similarly, the data strobe signal transmission circuit 230 can include a configuration identical to the control signal transmission circuit 210. More specifically, the data strobe signal transmission circuit 230 includes a first clock frequency division circuit 232, a second clock frequency division circuit 234, a phase adjusting circuit 236 and a duty cycle adjusting circuit 238.

The first clock frequency division circuit 232 is configured to divide the frequency of the data strobe reference clock signal DQSCLK to generate a first frequency divided clock signal DQSCD1. The second clock frequency division circuit 234 is configured to divide the frequency of the first frequency divided clock signal DQSCD1 to generate a second frequency divided clock signal DQSCD2.

The phase adjusting circuit 236 is configured to receive the access signal, e.g. the data strobe signal DQS in the data signal DATA, from the memory access controller 100, to adjust the phase of the data strobe signal DQS according to the second frequency divided clock signal DQSCD2 to generate a phase-adjusted access signal, e.g. the phase-adjusted data strobe signal DQSP.

The duty cycle adjusting circuit 238 is configured to adjust a duty cycle of the phase-adjusted data strobe signal DQSP to be a half of a time period according to the first frequency divided clock signal DQSCD1 to generate and transmit an output access signal, e.g. the output data strobe signal DQSO, to the memory device 120 to access the memory device 120.

Similarly, the data signal transmission circuit 240 can include a configuration identical to the control signal transmission circuit 210. More specifically, the data signal transmission circuit 240 includes a first clock frequency division circuit 242, a second clock frequency division circuit 244, a phase adjusting circuit 246 and a duty cycle adjusting circuit 248.

The first clock frequency division circuit 242 is configured to divide the frequency of the data reference clock signal DQCLK to generate a first frequency divided clock signal DQCD1. The second clock frequency division circuit 244 is configured to divide the frequency of the first frequency divided clock signal DQCD1 to generate a second frequency divided clock signal DQCD2.

The phase adjusting circuit 246 is configured to receive the access signal, e.g. the data signal DQ in the data signal DATA, from the memory access controller 100, to adjust the phase of the data signal DQ according to the second frequency divided clock signal DQCD2 to generate a phase-adjusted access signal, e.g. the phase-adjusted data signal DQP.

The duty cycle adjusting circuit 248 is configured to adjust a duty cycle of the phase-adjusted data signal DQP to be a half of a time period according to the first frequency divided clock signal DQCD1 to generate and transmit an output access signal, e.g. the output data signal DQO, to the memory device 120 to access the memory device 120.

In an embodiment the output control signal CONO generated by the control signal transmission circuit 210 and the output data strobe signal DQSO generated by the data strobe signal transmission circuit 230 are respectively transmitted to the memory device 120 through an independent path. The output command signal CMDO and the output address signal ADRO generated by the command and address signal transmission circuit 220 and the output data signal DQO generated by the data signal transmission circuit 240 are transmitted to the memory device 120 through the same output path.

More specifically, in an embodiment, the memory access interface device 120 further includes a multiplexer 250 (abbreviated as MUX in FIG. 2) electrically coupled to the command and address signal transmission circuit 220 and the data signal transmission circuit 240 to output one of the output command signal CMDO, the output address signal ADRO and the output data signal DQO to the memory device 120 through the same output path.

Figure 3:
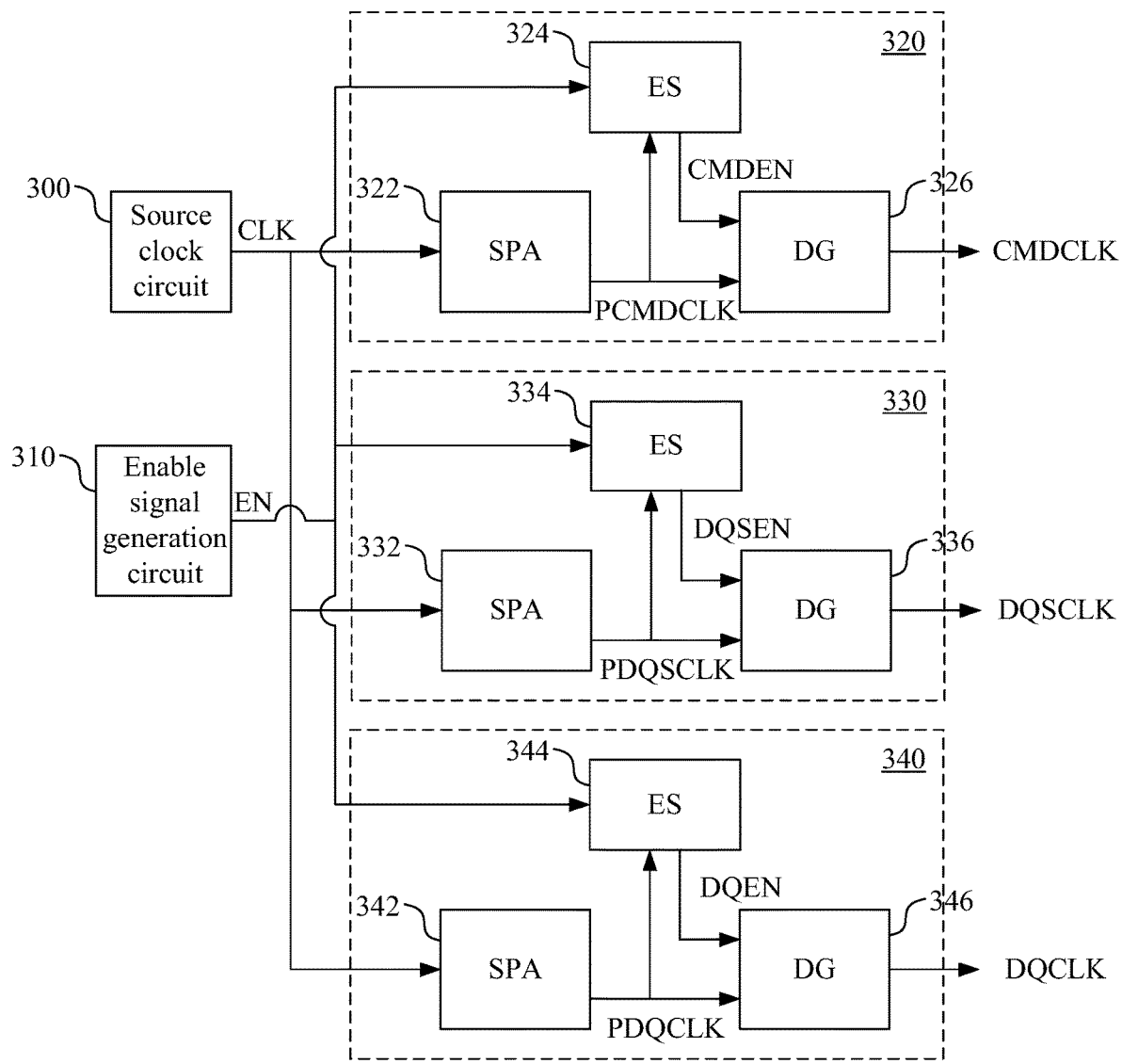
FIG. 3 is a detailed block diagram of the clock generation circuit in FIG. 2 in an embodiment of the present invention.
Figure 4:
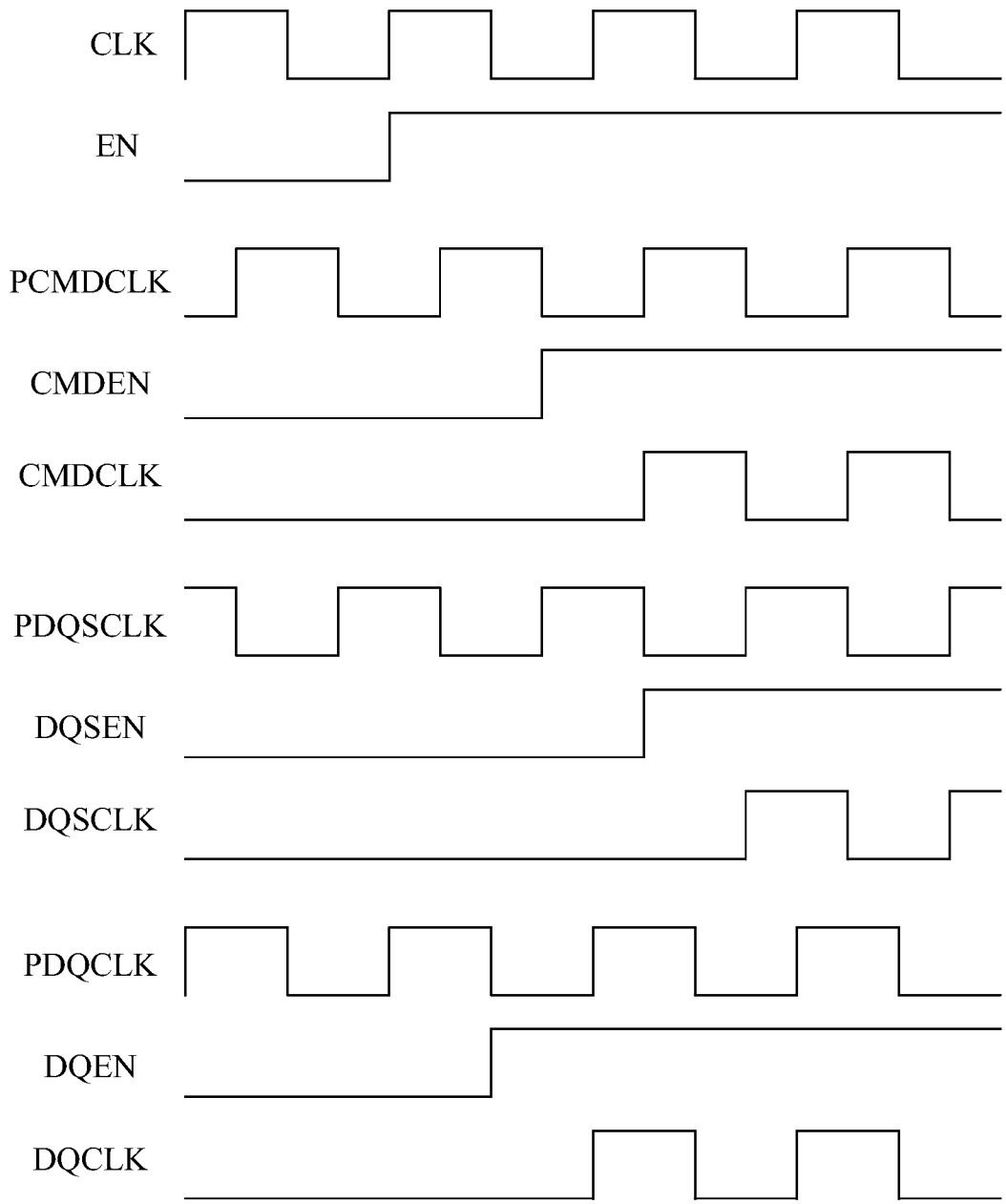
FIG. 4 is a diagram of waveforms of each of the signals operated in the clock generation circuit in an embodiment of the present invention.

Reference is now made to FIG. 3 and FIG. 4 at the same time. FIG. 3 is a detailed block diagram of the clock generation circuit 200 in FIG. 2 in an embodiment of the present invention. FIG. 4 is a diagram of waveforms of each of the signals operated in the clock generation circuit 200 in an embodiment of the present invention.

The clock generation circuit 200 includes a source clock circuit 300, an enable signal generation circuit 310 and a plurality of clock phase adjusting circuits 320-340.

In an embodiment, the source clock circuit 300 can be such as, but not limited to an oscillator and is configured to generate a source clock signal CLK. The enable signal generation circuit 310 is configured to generate an enable signal EN.

In an embodiment, the clock phase adjusting circuits 320-340 include a command clock phase adjusting circuit 320, a data strobe clock phase adjusting circuit 330 and a data clock phase adjusting circuit 340.

Take the command clock phase adjusting circuit 320 as an example, the command clock phase adjusting circuit 320 includes a source phase adjusting circuit 322 (abbreviated as SPA in FIG. 3), an enable synchronization circuit 324 (abbreviated as ES in FIG. 3) and a de-glitch circuit 326 (abbreviated as DG in FIG. 3).

The source phase adjusting circuit 322 is configured to receive the source clock signal CLK to adjust the phase of the source clock signal CLK to generate a phase-adjusted clock signal, e.g: the phase-adjusted command clock signal PCMDCLK. In the present embodiment, as illustrated in FIG. 4, the phase-adjusted command clock signal PCMDCLK is delayed from the source clock signal CLK by 90 degrees.

The enable synchronization circuit 324 is configured to receive the phase-adjusted command clock signal PCMDCLK and the enable signal EN to adjust the enable signal EN according to the phase-adjusted command clock signal PCMDCLK to generate a phase-adjusted enable signal, e.g.

the phase-adjusted command enable signal CMDEN, having a phase the same with the phase-adjusted command clock signal PCMDCLK.

The de-glitch circuit 326 is configured to receive the phase-adjusted command enable signal CMDEN and the phase-adjusted command clock signal PCMDCLK to be enabled by the phase-adjusted command enable signal CMDEN to output the phase-adjusted clock signal as the command reference clock signal CMDCLK.

The data strobe clock phase adjusting circuit 330 may include a configuration identical to the command clock phase adjusting circuit 320. More specifically, the data strobe clock phase adjusting circuit 330 includes a source phase adjusting circuit 332, an enable synchronization circuit 334 and a de-glitch circuit 336.

The source phase adjusting circuit 332 is configured to receive the source clock signal CLK to adjust the phase of the source clock signal CLK to generate a phase-adjusted clock signal, e.g. the phase-adjusted data strobe clock signal PDQSCLK. In the present embodiment, as illustrated in FIG. 4, the phase-adjusted data strobe clock signal PDQSCLK is delayed from the source clock signal CLK by 270 degrees.

The enable synchronization circuit 334 is configured to receive the phase-adjusted data strobe clock signal PDQSCLK and the enable signal EN to adjust the enable signal EN according to the phase-adjusted data strobe clock signal PDQSCLK to generate a phase-adjusted enable signal, e.g. the phase-adjusted data strobe enable signal DQSEN, having a phase the same with the phase-adjusted data strobe clock signal PDQSCLK.

The de-glitch circuit 336 is configured to receive the phase-adjusted data strobe enable signal DQSEN and the phase-adjusted data strobe clock signal PDQSCLK to be enabled by the phase-adjusted data strobe enable signal DQSEN to output the phase-adjusted clock signal as the data strobe reference clock signal DQSCLK.

The data clock phase adjusting circuit 340 may include a configuration identical to the command clock phase adjusting circuit 320. More specifically, the data clock phase adjusting circuit 340 includes a source phase adjusting circuit 342, an enable synchronization circuit 344 and a de-glitch circuit 346.

The source phase adjusting circuit 342 is configured to receive the source clock signal CLK to adjust the phase of the source clock signal CLK to generate a phase-adjusted clock signal, e.g. the phase-adjusted data clock signal PDQCLK. In the present embodiment, as illustrated in FIG. 4, the phase-adjusted data clock signal PDQCLK has the same phase with the source clock signal CLK. In other words, the phase difference between the phase-adjusted data clock signal PDQCLK and h the source clock signal CLK is 0.

The enable synchronization circuit 344 is configured to receive the phase-adjusted data clock signal PDQCLK and the enable signal EN to adjust the enable signal EN according to the phase-adjusted data clock signal PDQCLK to generate a phase-adjusted enable signal, e.g. the phase-adjusted data enable signal DQEN, having a phase the same with the phase-adjusted data clock signal PDQCLK.

The de-glitch circuit 346 is configured to receive the phase-adjusted data enable signal DQEN and the phase-adjusted data clock signal PDQCLK to be enabled by the phase-adjusted data enable signal DQEN to output the phase-adjusted clock signal as the data reference clock signal DQCLK.

By using the configuration of the clock generation circuit in FIG. 3, the clock generation circuit 200 can generate the command reference clock signal CMDCLK, the data strobe reference clock signal DQSCLK and the data reference clock signal DQCLK that are independent from each other and each having an adjustable phase. As a result, the memory access interface device 110 can provide a precise signal calibration mechanism.

In an embodiment, the signal calibration can be performed in accompany with the memory access controller 100 such that the memory access controller 100 delivers the access signals to access content in the memory device 120 through the memory access interface device 110 and compares the accessed result with the content provided actively by the memory device 120. The comparison result is used to control the phase adjusting mechanism of the clock generation circuit 200 to accomplish the signal calibration mechanism.

It is appreciated that the de-glitch circuit of each of the clock phase adjusting circuits 320-340, e.g. the de-glitch circuit 326 is enabled by the phase-adjusted command enable signal CMDEN at any one of a waveform of the phase-adjusted command clock signal PCMDCLK having an even number count.

Figure 5A:
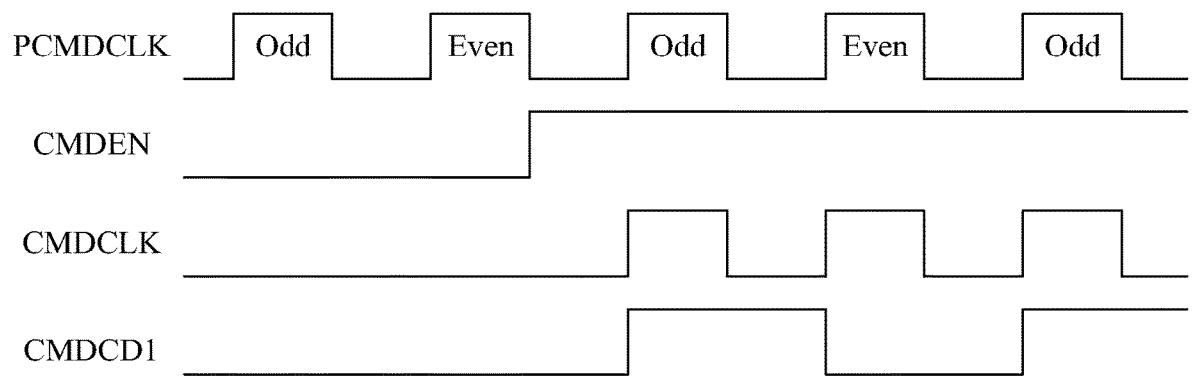
FIG. 5A and FIG. 5B are diagrams of waveforms of the signals related to the command clock phase adjusting circuit in an embodiment of the present invention.
Figure 5B:
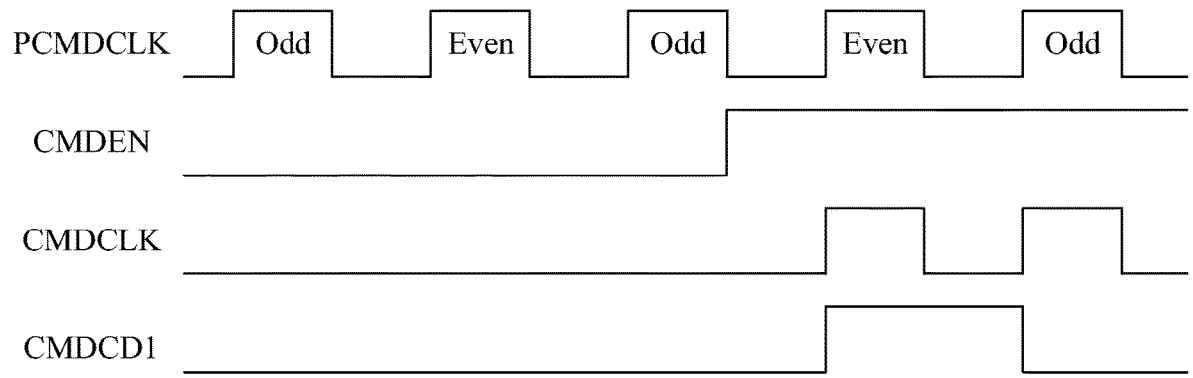

Reference is now made to FIG. 5A and FIG. 5B. FIG. 5A and FIG. 5B are diagrams of waveforms of the signals related to the command clock phase adjusting circuit 320 in an embodiment of the present invention.

As illustrated in FIG. 5A, the phase-adjusted command clock signal PCMDCLK is delayed from the source clock signal CLK by 90 degrees and is outputted as the command reference clock signal CMDCLK according to the enabling of the phase-adjusted command enable signal CMDEN at one of the waveform of the phase-adjusted command clock signal PCMDCLK having the even number count. If the frequency of the command reference clock signal CMDCLK is further divided by 2 by the first clock frequency division circuit 212, the phase difference becomes 90/2=45 degrees.

However, as illustrated in FIG. 5B, the delayed phase-adjusted command clock signal PCMDCLK is outputted as the command reference clock signal CMDCLK according to the enabling of the phase-adjusted command enable signal CMDEN at one of the waveform of the phase-adjusted command clock signal PCMDCLK having the odd number count. If the frequency of the command reference clock signal CMDCLK is further divided by 2 by the first clock frequency division circuit 212, the phase difference becomes 90/2+180=225. The output result in FIG. 5B is the inverse of the output result in FIG. 5A and output result in FIG. 5B is inaccurate relative to the original phase-adjusted command clock signal PCMDCLK not outputted yet.

As a result, the memory access interface device 110 is able to provide reference clock signals that are independent from each other, each having an adjustable phase and are within a large range of frequencies. The duty cycle of the output access signal can be guaranteed to be half of a time period. Further, the phase of the access signals can be adjusted accurately to access the memory device 120.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory access interface device comprising:
   a clock generation circuit configured to generate a plurality of reference clock signals that are independent from each other and each having an adjustable phase according to a source clock signal;
   a plurality of access signal transmission circuits each comprising:
      a first clock frequency division circuit configured to divide the frequency of one of the reference clock signals to generate a first frequency divided clock signal;
      a second clock frequency division circuit configured to divide the frequency of the first frequency divided clock signal to generate a second frequency divided clock signal;
      a phase adjusting circuit configured to receive an access signal from a memory access controller to adjust a phase of the access signal according to the second frequency divided clock signal to generate a phase-adjusted access signal; and
      a duty cycle adjusting circuit configured to adjust a duty cycle of the phase-adjusted access signal to generate and transmit an output access signal to a memory device to access the memory device.

2. The memory access interface device of claim 1, wherein the duty cycle adjusting circuit is configured to adjust the duty cycle of the phase-adjusted access signal to be a half of a time period according to the first frequency divided clock signal.

3. The memory access interface device of claim 1, wherein the plurality of access signal transmission circuits comprise:
   a control signal transmission circuit, wherein the access signal received by the control signal transmission circuit from the memory access control is a control signal, one of the reference clock signals received by the control signal transmission circuit from the clock generation circuit is a command reference clock signal, and the output access signal generated by the control signal transmission circuit is an output control signal;
   a command and address signal transmission circuit, wherein the access signal received by the command and address signal transmission circuit from the memory access control is a command signal or an address signal, one of the reference clock signals received by the command and address signal transmission circuit from the clock generation circuit is the command reference clock signal, and the output access signal generated by the command and address signal transmission circuit is an output command signal or an output address signal; and
   a data signal transmission circuit, wherein the access signal received by the data signal transmission circuit from the memory access control is a data signal, one of the reference clock signals received by the data signal transmission circuit from the clock generation circuit is a data reference clock signal, and the output access signal generated by the data signal transmission circuit is an output data signal.

4. The memory access interface device of claim 3, wherein the plurality of access signal transmission circuits further comprise:
   a data strobe signal transmission circuit, wherein the access signal received by the data signal transmission circuit from the memory access control is a data strobe signal, one of the reference clock signals received by the data signal transmission circuit from the clock generation circuit is a data strobe reference clock signal, and the output access signal generated by the data strobe signal transmission circuit is an output data strobe signal.

5. The memory access interface device of claim 3, wherein the data signal, the command signal and the address signal are received from the memory access controller through a same input path, and the memory access interface device further comprises:
   a multiplexer electrically coupled to the command and address signal transmission circuit and the data signal transmission circuit and configured to select one of the output command signal, the output address signal and the output data signal to be transmitted to the memory device through a same output path.

6. The memory access interface device of claim 3, wherein the control signal transmission circuit and the command and address signal transmission circuit share the same first clock frequency division circuit and the same second clock frequency division circuit.

7. The memory access interface device of claim 1, wherein the clock generation circuit comprises:
   a source clock circuit configured to generate the source clock signal;
   an enable signal generation circuit configured to generate an enable signal; and
   a plurality of clock phase adjusting circuits each comprising:
      a source phase adjusting circuit configured to receive the source clock signal to adjust the phase of the source clock signal to generate a phase-adjusted clock signal;
      an enable synchronization circuit configured to receive the phase-adjusted clock signal and the enable signal to adjust the enable signal according to the phase-adjusted clock signal to generate a phase-adjusted enable signal having a phase the same with the phase-adjusted clock signal; and
      a de-glitch circuit configured to receive the phase-adjusted enable signal and the phase-adjusted clock signal to be enabled by the phase-adjusted enable signal to output the phase-adjusted clock signal as one of the reference clock signals.

8. The memory access interface device of claim 7, wherein the de-glitch circuit is enabled by the phase-adjusted enable signal at any one of a waveform of the phase-adjusted clock signal having an even number count.

9. The memory access interface device of claim 1, wherein when a rising edge of the second frequency divided clock signal is within a set-up and hold time of a waveform of the access signal, the phase adjusting circuit adjusts the phase of the access signal according to a sample result of the rising edge and a falling edge of the second frequency divided clock signal.

10. The memory access interface device of claim 1, wherein the memory device is a NAND flash memory operated in a single data rate (SDR) mode or a double data rate (DDR) mode.

11. The memory access interface device of claim 1, wherein a frequency range of the first clock divided clock signal generated by the first clock frequency division circuit is between 5 MHz and 1200 MHz.

* * * * *